(12) United States Patent
Quinn et al.

(10) Patent No.: US 11,196,030 B2
(45) Date of Patent: Dec. 7, 2021

(54) HIGH EFFICIENCY VAPOR TRANSPORT SUBLIMATION SOURCE USING BAFFLES COATED WITH SOURCE MATERIAL

(71) Applicant: Universal Display Corporation, Ewing, NJ (US)

(72) Inventors: William E. Quinn, Whitehouse Station, NJ (US); Gregory McGraw, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 71 days.

(21) Appl. No.: 16/659,803

(22) Filed: Oct. 22, 2019

(65) Prior Publication Data
US 2020/0119315 A1    Apr. 16, 2020

Related U.S. Application Data

(62) Division of application No. 15/492,556, filed on Apr. 20, 2017, now Pat. No. 10,483,498.

(60) Provisional application No. 62/326,310, filed on Apr. 22, 2016.

(51) Int. Cl.
| | |
|---|---|
| *H01L 51/56* | (2006.01) |
| *H01L 51/00* | (2006.01) |
| *C23C 16/455* | (2006.01) |
| *C23C 16/448* | (2006.01) |

(52) U.S. Cl.
CPC .......... *H01L 51/56* (2013.01); *C23C 16/4481* (2013.01); *C23C 16/45561* (2013.01); *H01L 51/0002* (2013.01); *H01L 51/001* (2013.01)

(58) Field of Classification Search
CPC .......... C23C 16/4881; C23C 16/45561; C23C 16/463; H01L 51/001; H01L 51/56; H01L 51/002; F15D 1/0005
USPC .................. 137/268; 427/255.6; 118/719
See application file for complete search history.

(56) References Cited

U.S. PATENT DOCUMENTS

| | | | | |
|---|---|---|---|---|
| 4,769,292 A | ‡ | 9/1988 | Tang | H01L 51/0064 313/50 |
| 4,916,089 A | ‡ | 4/1990 | Van Suchtelen | B01J 4/02 117/102 |
| 5,247,190 A | ‡ | 9/1993 | Friend | C09K 11/06 257/40 |
| 5,377,616 A | * | 1/1995 | Mihira | C23C 16/4485 117/104 |

(Continued)

FOREIGN PATENT DOCUMENTS

| | | |
|---|---|---|
| WO | 2008057394 A1 | 5/2008 |
| WO | 2010011390 A2 | 1/2010 |

OTHER PUBLICATIONS

Baldo et al.Highly efficient phosphorescent emission from organic electroluminescent devices, Nature, vol. 395, pp. 151-154, 1998.

(Continued)

*Primary Examiner* — Umashankar Venkatesan
(74) *Attorney, Agent, or Firm* — Butzel Long

(57) ABSTRACT

A source of material for use in a deposition system includes one or more baffles or equivalent structures within the source. The baffles provide for increased concentration of material entrained in a carrier gas that is passed through and emitted by the source.

11 Claims, 13 Drawing Sheets

(56) References Cited

U.S. PATENT DOCUMENTS

| | | | | |
|---|---|---|---|---|
| 5,703,436 A ‡ | 12/1997 | Forrest | ............... | C09K 11/06 313/50 |
| 5,707,745 A ‡ | 1/1998 | Forrest | ............... | C09K 11/06 428/43 |
| 5,834,893 A ‡ | 11/1998 | Bulovic | ............ | B82Y 10/00 313/50 |
| 5,844,363 A ‡ | 12/1998 | Gu | ................. | H01L 51/5012 313/50 |
| 5,904,771 A ‡ | 5/1999 | Tasaki | ............ | C23C 16/4481 117/105 |
| 6,013,982 A ‡ | 1/2000 | Thompson | ...... | H01L 27/3211 313/50 |
| 6,087,196 A ‡ | 7/2000 | Sturm | ............ | H01L 51/0001 438/29 |
| 6,091,195 A ‡ | 7/2000 | Forrest | ............ | H01L 51/5271 313/50 |
| 6,097,147 A ‡ | 8/2000 | Baldo | ............ | H01L 51/5096 313/49 |
| 6,117,498 A ‡ | 9/2000 | Chondroudis | ...... | C23C 14/12 427/250 |
| 6,294,398 B1 ‡ | 9/2001 | Kim | ............... | H01L 27/3281 257/40 |
| 6,303,238 B1 ‡ | 10/2001 | Thompson | ...... | C07D 487/22 252/30 |
| 6,337,102 B1 ‡ | 1/2002 | Forrest | ............... | C23C 14/12 427/64 |
| 6,468,819 B1 ‡ | 10/2002 | Kim | ............... | H01L 27/3281 438/22 |
| 7,122,085 B2 ‡ | 10/2006 | Shero | ............... | C23C 16/4481 118/726 |
| 7,279,704 B2 ‡ | 10/2007 | Walters | ............ | C09K 11/06 257/40 |
| 7,431,968 B1 ‡ | 10/2008 | Shtein | ............ | C23C 14/12 427/25 |
| 7,968,146 B2 ‡ | 6/2011 | Wagner | ........... | C23C 16/0245 427/24 |
| 2003/0230980 A1 ‡ | 12/2003 | Forrest | ............ | H01L 51/5016 313/60 |
| 2004/0048000 A1 * | 3/2004 | Shtein | ............ | C23C 14/042 427/69 |
| 2004/0174116 A1 ‡ | 9/2004 | Lu | ................. | H01L 51/0021 313/50 |
| 2013/0340680 A1 ‡ | 12/2013 | Sonoda | ............ | C23C 14/243 118/720 |
| 2016/0198626 A1 ‡ | 7/2016 | Lonsway | ......... | A01C 23/042 137/268 |
| 2019/0062914 A1 ‡ | 2/2019 | King | ............... | C23C 16/45561 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Forrest, S. R., "Ultrathin Organic Films Grown by Organic Molecular Beam Deposition and Related Techniques," Chemical Reviews, vol. 97, Iss 6, pp. 1793-1896 (Oct. 1, 1997.

\* cited by examiner

‡ imported from a related application 310   320   330

350

Distance in flow direction (m)

HIGH EFFICIENCY VAPOR TRANSPORT SUBLIMATION SOURCE USING BAFFLES COATED WITH SOURCE MATERIAL

CROSS-REFERENCE TO RELATED APPLICATIONS

This application is a divisional of U.S. application Ser. No. 15/492,556, filed Apr. 20, 2017, now U.S. Pat. No. 10,483,498, which is a non-provisional and claims the priority benefit of U.S. Provisional Patent Application Ser. No. 62/326,310, filed Apr. 22, 2016, the entire contents of each of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to a sublimation source suitable for fabricating devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

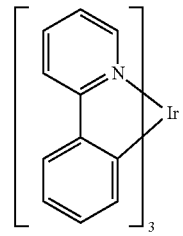

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an embodiment, a material source for a deposition system is provided, which includes a cavity having a gas inlet port and a gas outlet port distinct from the gas inlet port, a plurality of baffles disposed within the cavity and physically positioned within the cavity to prevent a direct gas flow between the gas inlet port and the gas outlet port, and a coating of a material to be entrained in an outflow of gas from the gas outlet port disposed on at least one baffle of the plurality of baffles. The coating may have a different thickness depending upon a position within the cavity of the at least one baffle on which the coating is deposited. For example, the coating may be thicker on a portion of the at least one baffle at a position closer to the gas inlet port than to the gas outlet port. One or more of the baffles may be removably disposed within the cavity. The baffles may be removable individually, or they may be removable as a unit. The baffles may be covered by a chemically inert coating. The material source may include a headspace available for gas flow over a transfer surface of one or more baffles. Such a headspace may be not greater than 5 mm, or not greater than 1 mm. The headspace may be defined by the area between adjacent baffles. The baffles may include a turbulence-inducing surface, such as arc-like structures to induce eddy flow, chevron structures, grooves, prominences, ridges, columnar arrays, arrays of hemispheres, or the like. The material coating the baffles may be disposed in a region between two baffles, for example, coating adjacent sides of adjacent baffles and/or filling the region between adjacent baffles. The spacing between adjacent baffles may vary along the flow path of carrier gas within the material source. For example, the baffles may be spaced more closely together closer to the outlet port. The material source may include a source of dilution gas flow, and/or may be connectable to a source of dilution gas.

In an embodiment, a method for operating a material source is provided, where the material source includes a cavity with a gas inlet port and a gas outlet port distinct from the gas inlet port, a plurality of baffles disposed within the cavity and physically positioned within the cavity to prevent a direct gas flow between the gas inlet port and the gas outlet port, and a coating disposed on at least one baffle of the plurality of baffles. The method may include providing a carrier gas to the cavity via the gas inlet port at sufficient velocity that the carrier gas exits the cavity via the gas outlet port. The method may further include operating the source at elevated temperature, and/or operating the source at a temperature gradient along a path between the gas inlet port and the gas outlet port. The material source may be maintained at a specific temperature, such as within 20 C of a sublimation temperature of the coating at vacuum, a temperature 5-20 C below a temperature at which a linear material source is maintained when used in the deposition system, or the like.

In an embodiment, a method for preparing a material source is provided, where the material source includes an apparatus having a cavity with a gas inlet port and a gas outlet port distinct from the gas inlet port, a plurality of baffles disposed within the cavity and physically positioned within the cavity to prevent a direct gas flow between the gas inlet port and the gas outlet port, and a coating disposed on at least one baffle of the plurality of baffle. The method may include cooling the material source apparatus below a sublimation temperature of a material to be deposited within the material source apparatus, and providing a carrier gas saturated with the material to be deposited to the cavity via the gas inlet port. The method may include maintaining the temperature of the cavity at a temperature not greater than a sublimation temperature of the material to be deposited, and/or maintaining a temperature gradient such that the baffle surfaces in proximity to the inlet port are warmer than the baffle surfaces in proximity to the outlet port. As a result, the organic material condensing on the baffles of the source may have fewer impurities than the material charge from which the organic vapor is generated. A temperature gradient also may be maintained such that that material deposits in the source so that deposited material is thicker on at least one baffle closer to the gas inlet port than to the gas outlet port.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
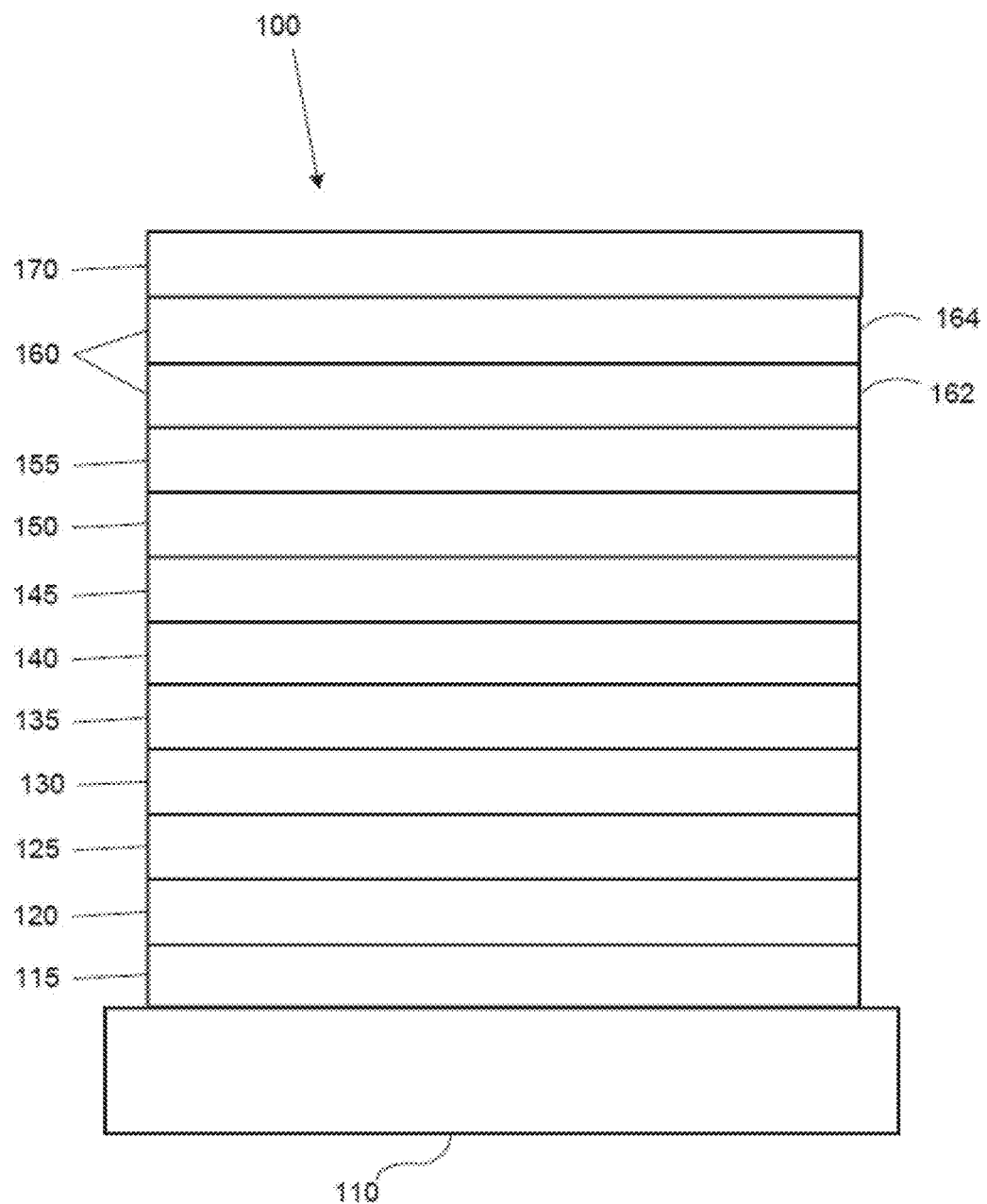
FIG. 1 shows an organic light emitting device including components that may be fabricated using embodiments disclosed herein.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
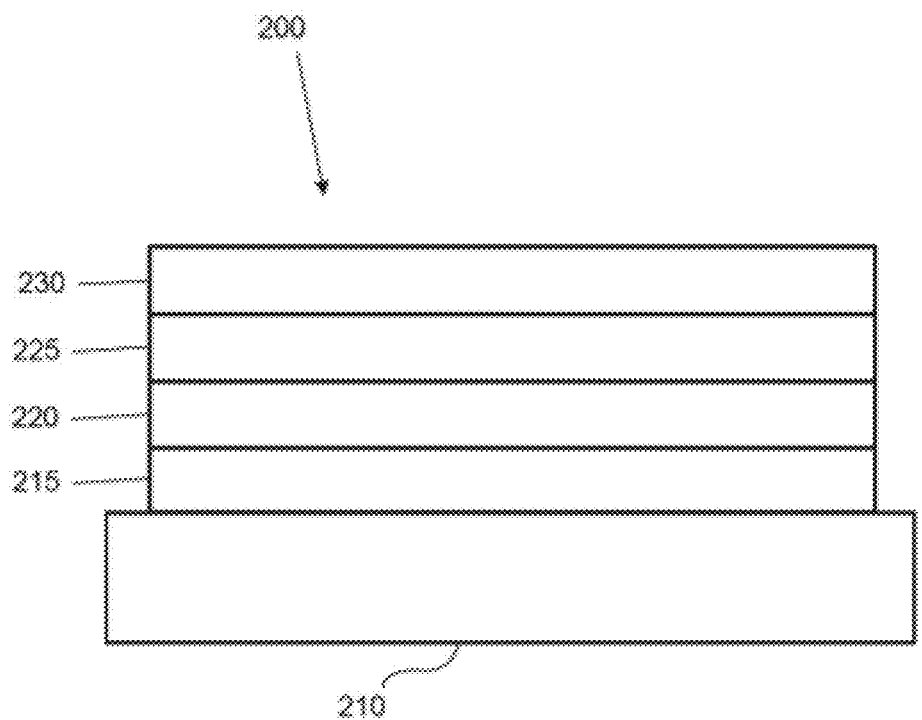
FIG. 2 shows an inverted organic light emitting device that does not have a separate electron transport layer, and which includes components that may be fabricated using embodiments disclosed herein.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays less than 2 inches diagonal, 3-D displays, virtual reality or augmented reality displays, vehicles, video walls comprising multiple displays tiled together, theater or stadium screens, and signs. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to +80 C.

Figure 3A:
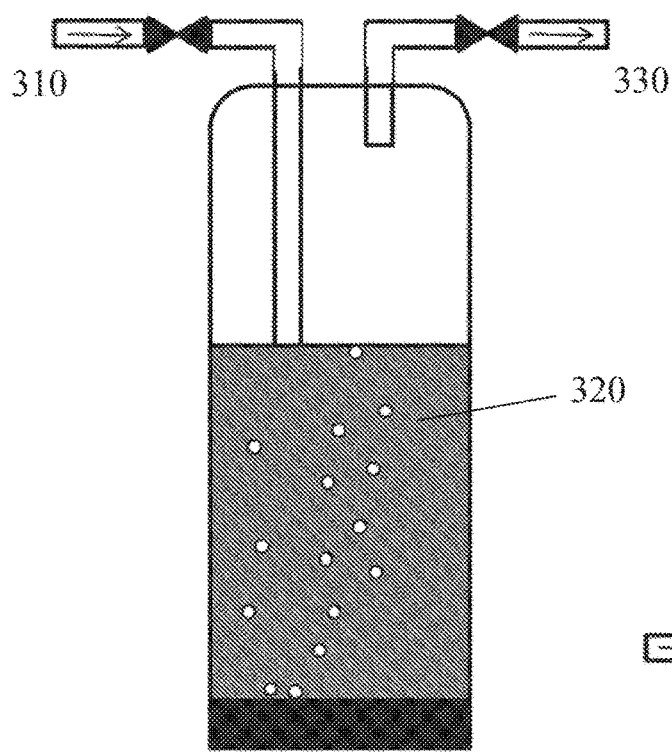
FIG. 3A shows a cross section of a conventional liquid bubbler source.

Transporting material by means of a saturated carrier gas from a storage container to the point of use is a common practice in techniques such as chemical vapor deposition (CVD), metal-organic CVD (MOCVD), atomic layer etching (ALE), atomic layer deposition (ALD), and other techniques used to fabricate semiconductors, OLEDs, and other devices. Such techniques may be used for materials that are liquid at the saturation or storage temperature. Saturation of a carrier gas is easily achieved by bubbling the carrier gas through a column of the liquid material. An example source that may be used with such techniques is shown in FIG. 3A. A carrier gas is transported through an inlet 310 and bubbled through the liquid material 320. The saturated carrier gas then exits the source via the outlet 330. The specific operation and use of a liquid source such as shown in FIG. 3A is commonly known by those of skill in the art.

Figure 3B:
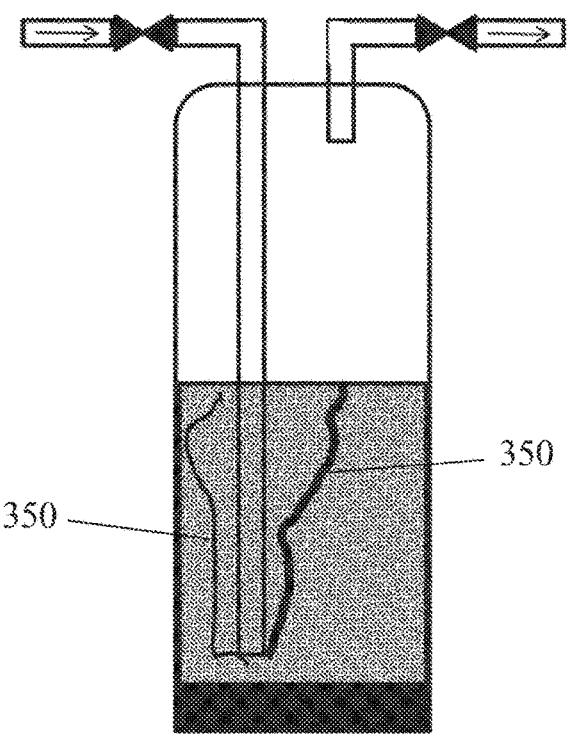
FIG. 3B shows a cross section of a conventional liquid source used with solid material, showing the gas pathways that develop along the paths of least resistance.

Many materials are solids at the temperatures of use. Saturation of a carrier gas vapor is often less than desired, or shows considerable variability, over the life of the source when using standard liquid-type bubblers with such materials. There are several reasons for the problems observed with solid sources. For example, the gas path through the solid material may be variable, and can depend on the particle size of the solid material. As shown in FIG. 3B, low impedance pathways 350 can develop in the solid material, resulting in a relatively small contact area and a low vapor saturation. Heat transfer is often relatively poor through the solid material.

Figure 4:
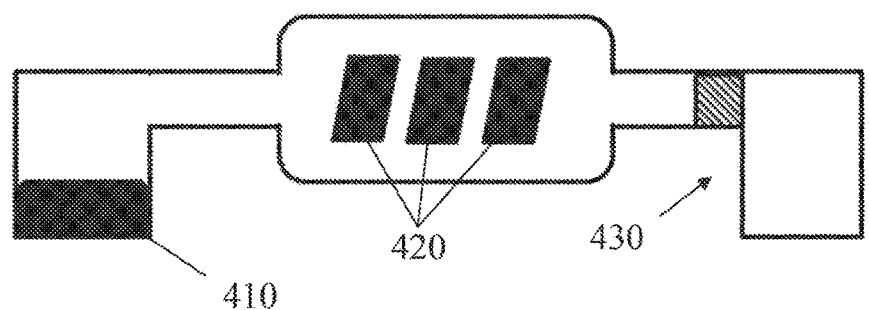
FIG. 4 is a drawing of a sublimation apparatus to deposit source material on mandrels that will become part of a source assembly according to an embodiment disclosed herein.

Embodiments disclosed herein provide a source design that may overcome the deficiencies listed above by depositing the solid material on baffles or mandrels which provide a consistent surface area of the solid material to be deposited. Sources as disclosed herein also may provide well-defined gas pathways through the source, and/or good thermal contact to the solid material. Source as disclosed herein may differ from conventional sources in that a material manufacturer may deposit the source material on mandrels by vapor phase evaporation, recrystallization, or precipitation as the last phase of purification. For example, FIG. 4 shows a sublimation apparatus to deposit source material on mandrels that will become part of a source assembly. An initial source of material 410 may be sublimated and transported through a chamber containing one or more mandrels 420 or similar structures, on which the sublimated material may be deposited. Residual carrier gas and other materials may be removed from the chamber via an outlet 430. The mandrels then may be used as baffles that are inserted into a source assembly to create a well-defined gas pathway. As described in further detail below, the gas pathway may create a velocity profile having an increasing velocity from entrance (inlet) to exit (outlet) within the source.

Figure 5A:
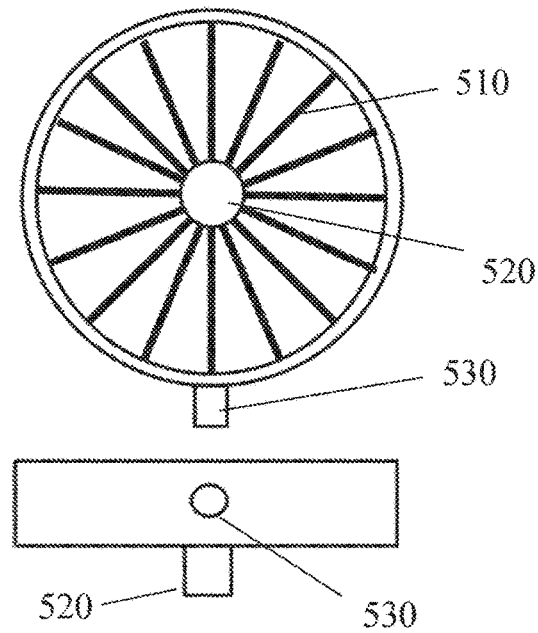
FIG. 5A shows a schematic representation of a round solid source with baffles arranged to accelerate the flow of carrier gas from entrance to exit according to an embodiment disclosed herein.
Figure 5B:
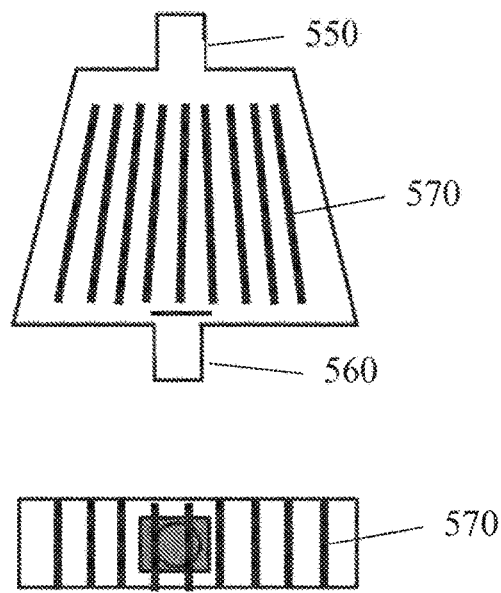
FIG. 5B shows a schematic representation of a trapezoidal source with baffles arranged to accelerate the gas velocity from entrance to exit according to an embodiment disclosed herein.

Various configurations of such a source may be used. For example, FIG. 5A shows top and side views of an example configuration of a source as disclosed herein. In this example, the coated mandrels are arranged as spokes 510 around a common center 520. Carrier gas may enter a cavity within the structure via one or more inlets 530 at the circumference, travel past the spokes, and exit through an outlet at the center 520. FIG. 5B shows another example source configuration in which the inlet and outlet are arranged in a linear configuration. In this example, carrier gas may enter the source at an inlet 550 disposed at one end of the source and exit at an outlet 560 disposed at the opposite end of the source. As the carrier gas travels through the source, it may become saturated with material disposed on the mandrels 570. The specific arrangements shown in FIGS. 5A and 5B are illustrative, and other arrangements may be used without departing from the scope of embodiments disclosed herein.

Figure 6:
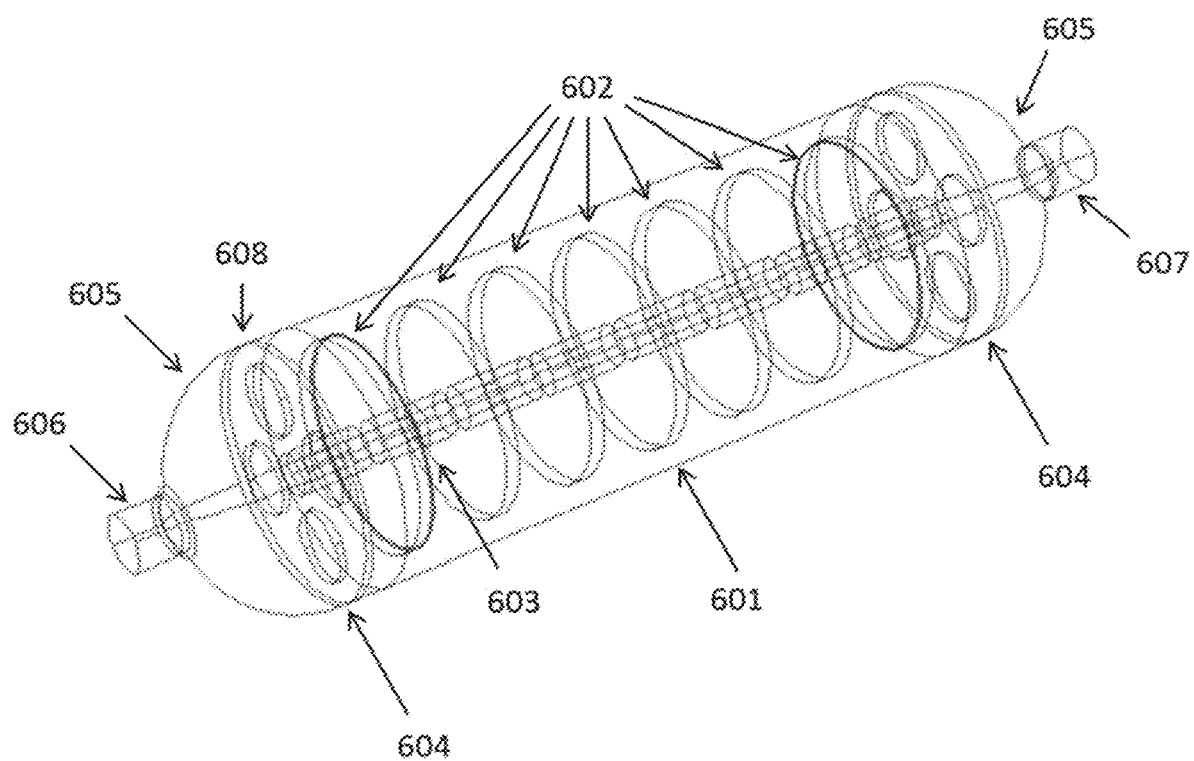
FIG. 6 shows a wire rendering a solid source containing internal baffles coated with sublimable material according to an embodiment disclosed herein.

In some embodiments, it may be beneficial to arrange the mandrels or similar structures within the source to create specific flows of carrier gas within the source. For example, FIG. 6 shows a wire rendering of a baffled source such as the one described in FIG. 4 in further detail. The arrangement includes a 2.54 cm inner diameter tube 601, which is 10 cm in length. The specific dimensions of the arrangement shown in FIG. 6 are provided for purposes of illustration and understanding, but more generally various other dimensions may be used. It may be preferred for a source such as this to be at least three times the inner diameter, so as to allow an adequate path length for the carrier gas to pick up organic vapor as it moved through the source. In general, it may be desirable to arrange the physical structures such as the baffles shown in FIG. 6 so as to provide a relatively high surface area coated with the material to be deposited, thereby providing a sufficient interface surface with the carrier gas to achieve a high rate of saturation. It also may be preferable for the baffles to be positioned so as to prevent a direct gas flow between the gas inlet port and the gas outlet port. For example, in the arrangement shown in FIG. 6, carrier gas cannot flow unimpeded from the inlet port 606 to the outlet port 607 without passing in close proximity to, flowing around or over, or otherwise coming into contact with one or more of the baffles 602. In some cases, the specific dimensions of the source may be selected for ease of use in existing systems that are configured to accept a particular size or arrangement of the physical source apparatus.

Inside the housing 601, a stack of seven disc baffles 602 about 2 cm in diameter are affixed to a 6 mm diameter mandrel 603. The mandrel may be attached to the source vessel by one or more radial supports 604. The ends of the tube may be bounded by reduction fittings 605 that terminate in inlet 606 and outlet 607 nipples. The source may include a reversibly sealed break 608 in the tube, for example to permit the mandrel to be changed, or it may be single unit as shown. Valves may be added upstream and downstream of the nipples 606, 607 to facilitate replacement.

A source as shown in FIG. 6 with the example dimensions provided above has an internal surface area of 134 $cm^2$. For comparison, the outer tube itself only has an internal surface area of 31.4 $cm^2$. The capacity of the source to store organic material scales proportionately with available surface area. Modeling indicates that the effluent gas from a source as shown and described will be 98% saturated, presuming all internal surfaces of the source are coated evenly with a solid film of sublimable material. This compares with 34% saturation from a tube shaped sublimation source without the discs 602 and mandrel 603. Thus, the presence of baffles as disclosed herein may increase both the quantity of material that a source of a given form factor can hold, and increase the level of saturation of its effluent vapor.

The shape of the control volume through which delivery gas flows will change as solid or liquid organic material evaporates from the source crucible. The surface area of exposed organic will change as the source material is consumed and the saturation of organic vapor produced by the source will decrease as it approaches exhaustion. If all of the material in a given area of the source is depleted, then that area of the source stops contributing vapor and the effluent saturation may drop. A reasonable goal may be for a source to expend 75% of its material and still generate saturation.

Figure 7:
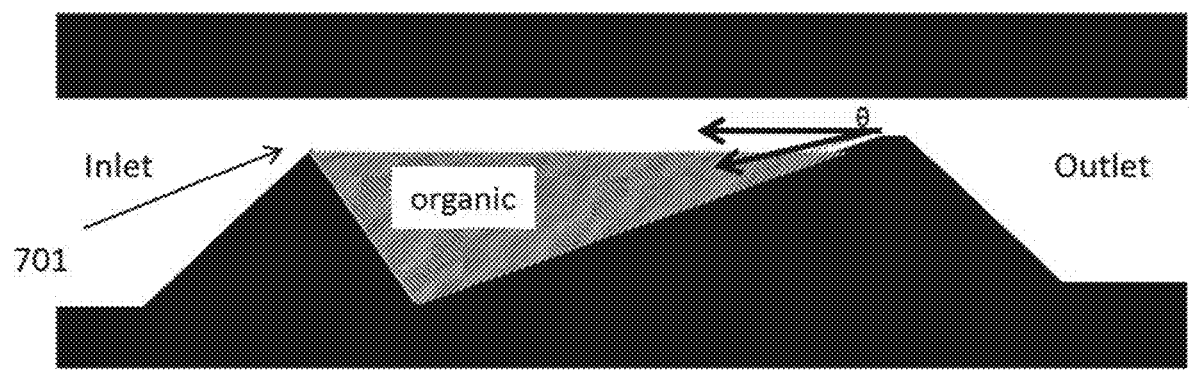
FIG. 7 is a schematic representation of a solid source with the majority of source material loaded near the entrance of the carrier gas according to an embodiment disclosed herein.

One way to achieve this result is to use a slanted crucible that places the deepest bed of organic material at the upstream end of the source where evaporation is fastest. More generally, the thickness of the organic material, which may be disposed as a coating on one or more baffles as disclosed herein, may vary depending upon the position of the material relative to the inlet and outlet port of the source. An example of such an arrangement is shown in FIG. 7. A carrier gas may enter the source via the inlet, pass over the organic material, and exit the source via the outlet. As the organic material evaporates from the upstream end 701, the headspace becomes larger and the evaporation rate of the organic material decreases. More generally, the coating of material on a baffle or other source structure as disclosed herein may be thicker on a portion of the baffle closer to the inlet port than to the outlet port, and thinner on a portion of the baffle that is closer to the outlet port. This source design may be unsuitable or less suitable for liquid sources or loose powders that may shift during evaporation.

Figure 8:
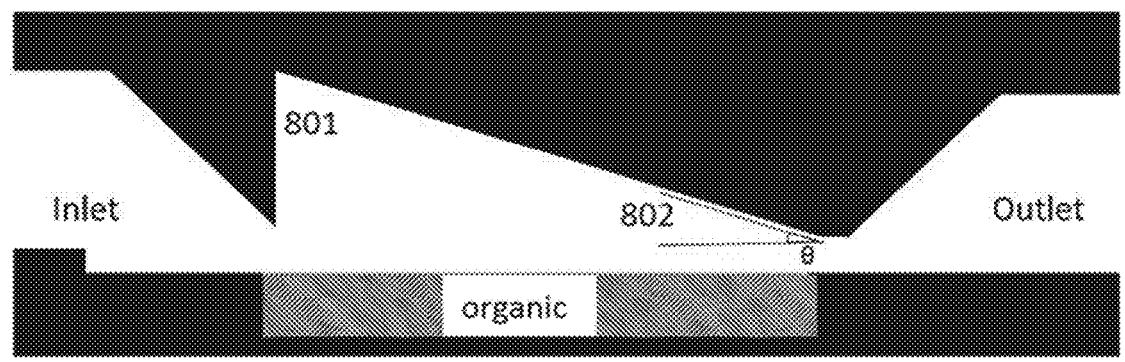
FIG. 8 is a schematic of a source that accelerates carrier gas along its flow path according to an embodiment disclosed herein.

Another approach is to vary the headspace over a flat crucible, as shown in FIG. 8. In this configuration, the headspace is large near the inlet 801, and gradually slopes downward closer to the outlet 802. The larger headspace slows evaporation near the inlet, thus permitting more even evaporation over time along the length of the source. In some embodiments it may be preferred to limit the headspace in such a configuration. For example, for a source having dimensions on the order of those described herein, it may be preferred for the headspace of a source to be not more than 5 mm, 2 mm, or 1 mm. In configurations that use adjacent and/or interdigitated baffles as disclosed herein, the "headspace" of a portion of material within the source may be defined by the distance between one baffle and an adjacent baffle. That is, the "headspace" in such a configuration may refer to the distance from the material to the next physical structure disposed adjacent to the component on which the material is disposed, which may or may not be an outer portion of the overall source structure.

Figure 9A:
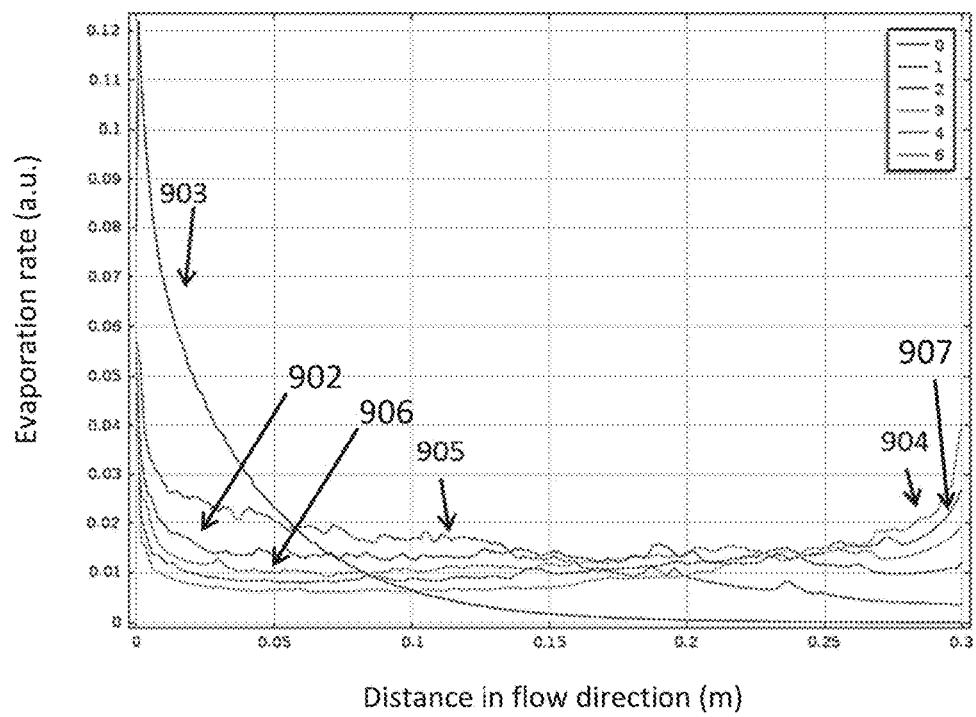
FIGS. 9A and 9B show a plot of the rate of evaporation from a source as shown in FIG. 8 as a function of flow path according to an embodiment disclosed herein.
Figure 9B:
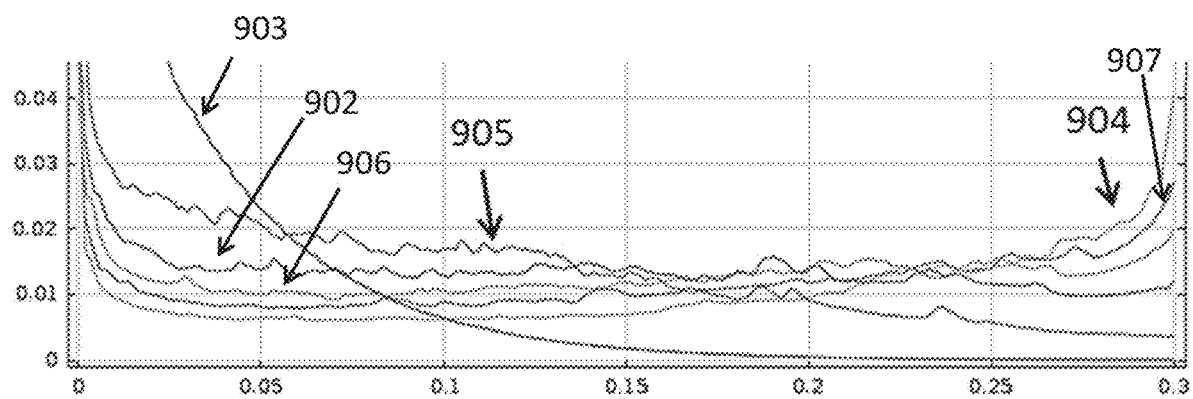

FIGS. 9A and 9B show simulation results for an evaporation source of the general arrangement shown in FIG. 8. FIG. 9B shows an expanded view of the bottom portion of FIG. 9A. The simulation is for a 300 mm long, 10 mm wide evaporation source with a limiting downstream headspace of 1 mm and a taper angle θ of the top varying from 0-6°. The magnitude of diffusive flux is proportional to the evaporation rate. FIGS. 9A-9B show the diffusive flux as a function of length along the flow path. The vertical axis shows the evaporation rate in arbitrary units and the horizontal axis shows the distance along the source in the flow direction in meters. Each line plots the evaporation rate over length for a given angle of 0° (903), 1° (905), 2° (902), 3° (906), 4° (907), and 6° (904). The 0° configuration 903 has the highest evaporation rate near the inlet and the lowest evaporation rate near the outlet when compared with the other cases. The 6° case 904, conversely, has the highest evaporation rate near the outlet and the lowest near the inlet. The intermediate cases fall between them. The case of a 1° angle 905 appears to be optimal. Evaporation is much more spatially uniform than the 0° case, while achieving a saturation of 95%.

Figure 10:
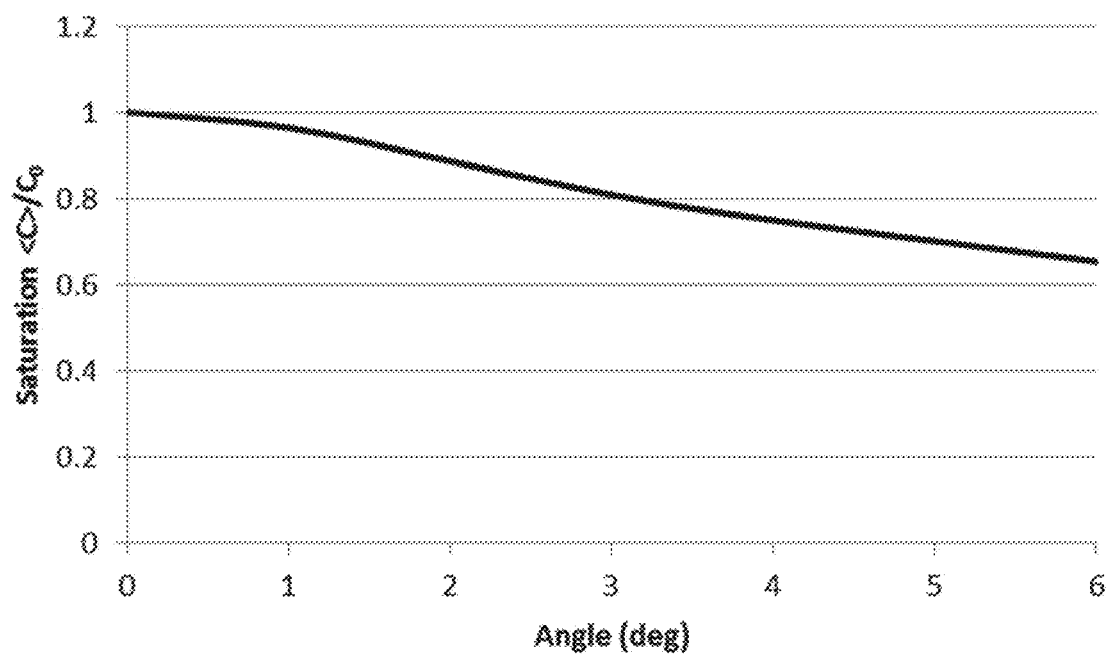
FIG. 10 shows a saturation achievable by a source as shown in FIG. 8 function of source angle according to an embodiment disclosed herein.

More spatially uniform evaporation rates may be achieved for larger angles. However, in some cases, the saturation may decrease. FIG. 10 shows simulation results for the saturation of effluent flow as a function of the taper angle of the headspace, for a configuration as shown in FIG. 8. The saturation of the effluent flow shown on the vertical axis gives is defined as the concentration of vapor per equilibrium concentration, at the temperature of the source.

Another technique to preserve the surface area of an evaporation bed as the material within the source depletes is to operate the source with a temperature gradient along the delivery gas flow path. The temperature of the material within the source smoothly varies from the coolest region, adjacent to the delivery gas inlet, to the warmest region, adjacent to the delivery gas outlet. Because delivery gas near the inlet is unladed with organic vapor, a low vapor pressure of organic material is sufficient to drive its transport into the delivery gas near the inlet. The concentration of organic vapor in the delivery gas increases further downstream, so a greater partial pressure of organic vapor is required to drive mass transport into the delivery gas at the same rate. The equilibrium partial pressure P* of organic vapor is characterized by the well-known Clausius-Clapyeron equation, where $P_0^*$ is a scaling constant, $\Delta H_v$ is the enthalpy of vaporization of the organic material, R is the gas constant, and T is temperature:

$$P^* = P_0^* e^{\frac{-\Delta H_v}{RT}}$$

Figure 11:
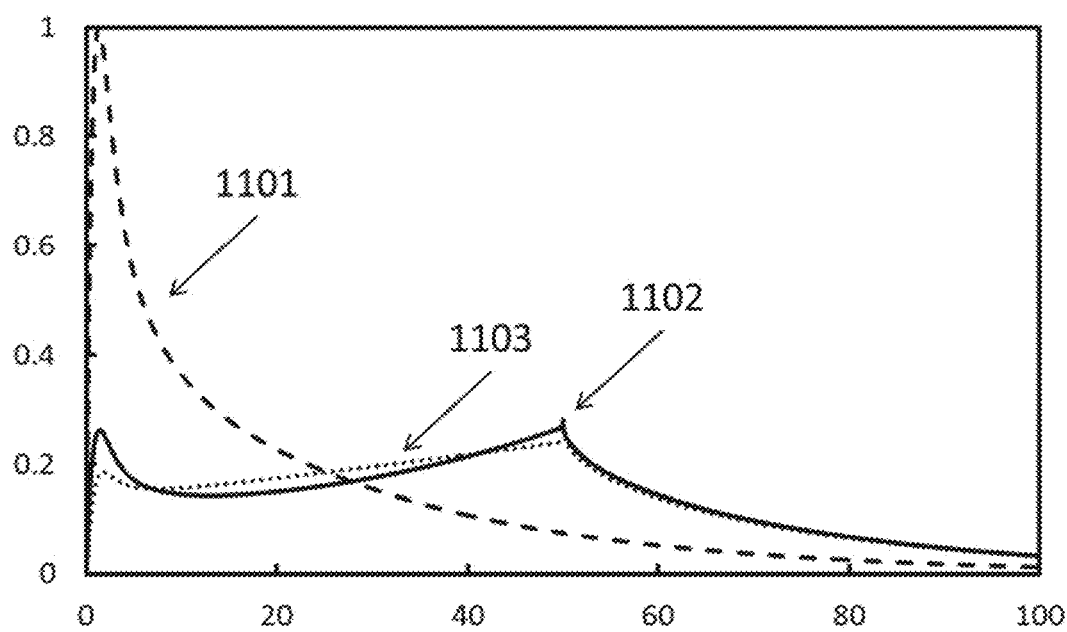
FIG. 11 shows a rate of evaporation from a non-isothermal source as a function of flow path according to an embodiment disclosed herein.

This relationship may be applied to a sublimation source as disclosed herein, which includes a hollow tube with walls coated in sublimable organic material. For example, an illustrative arrangement may include a tube 2.54 cm in diameter and 100 cm in length, designed to produce 1 slm of helium delivery gas at a pressure of 200 Torr that is 95% saturated with organic vapor. A typical value for $H_v$ of 160 kJ/mol may be assumed for the source material. The wall temperature varies as T=517 K+40(K/m)z, where z is the distance from the inlet, for the first 50 cm of tube length. The temperature further downstream may be 537 K to permit saturation at the higher vapor pressure before it leaves the outlet. The rate of sublimation from the inner surface of a cylindrical tube source is plotted as a function of distance along the delivery gas flow path in FIG. 11. Line 1101 shows the sublimation rate as a function of path length for a source tube uniformly heated to 537 K, while line 1102 shows the sublimation rate for a source with the specified temperature ramp along its path length. A non-uniform temperature distribution may cause evaporation to be much more evenly distributed across the length of the source, resulting in more even depletion of the material source. Since the surface area of the sublimation bed varies much more slowly, the source can produce saturated vapor longer, improving reproducibility and decreasing waste material. In some embodiments, it may be desirable to maintain a source as disclosed herein at an elevated temperature relative to the ambient environment and/or relative to sublimation of the material used in the source. More generally, the material source may be maintained at a temperature within 20 C of the sublimation temperature of the material at vacuum. This may be significantly lower than a comparable linear source (i.e., one omitting baffles or similar structures as disclosed herein) of some or all of the source flow path length. For example, sources as disclosed herein may be operated at temperatures about 5-20 C below the temperature at which an equivalent linear source would require in the same deposition system.

A "coated baffle" configuration, such as described with respect to FIG. 6, may be well suited to the use of thermal gradients to regulate local evaporation rates. Each baffle assembly may be differentially heated, leading to a continuously-varying temperature across the sublimation bed. The evaporation rate distribution 1103 along the source can be made more uniform if the temperature distribution follows a square root profile T=507K+42.2K/m0.5 z0.5.

Figure 12:
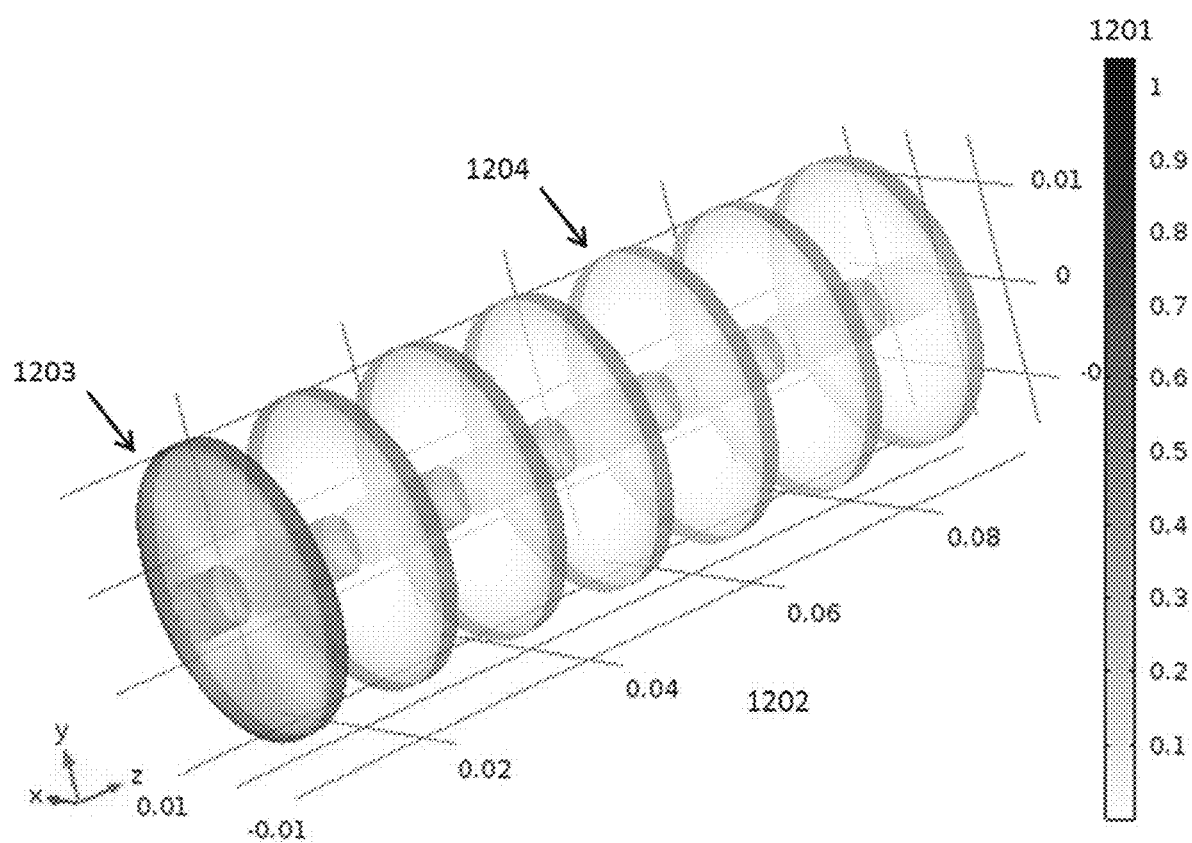
FIG. 12 shows expected evaporation rates from the surface of a mandrel assembly used in a sublimation source according to an embodiment disclosed herein.

Alternatively or in addition, downstream baffles may be arranged so that streamlines of delivery gas that are unladed with organic vapor come in contact with the baffles. This may reduce the source surface area required to achieve a desired saturation, and also may permit more uniform utilization of material within the source. FIG. 12 shows the normalized rate of material evaporation 1201 from a coated baffle source using a disc and mandrel arrangement as shown in FIG. 6. The coordinate axes 1202 are shown in meters. Dark regions 1203 indicate areas where material evaporates relatively rapidly, while lighter regions 1204 indicate slower evaporation. As FIG. 12 illustrates, the molar flux of evaporating material from the mandrel from the example in FIGS. 3 and 4 is spatially uneven. Material will deplete quickly from areas of high flux and the saturation of material leaving the source will drop precipitously.

Figure 13A:
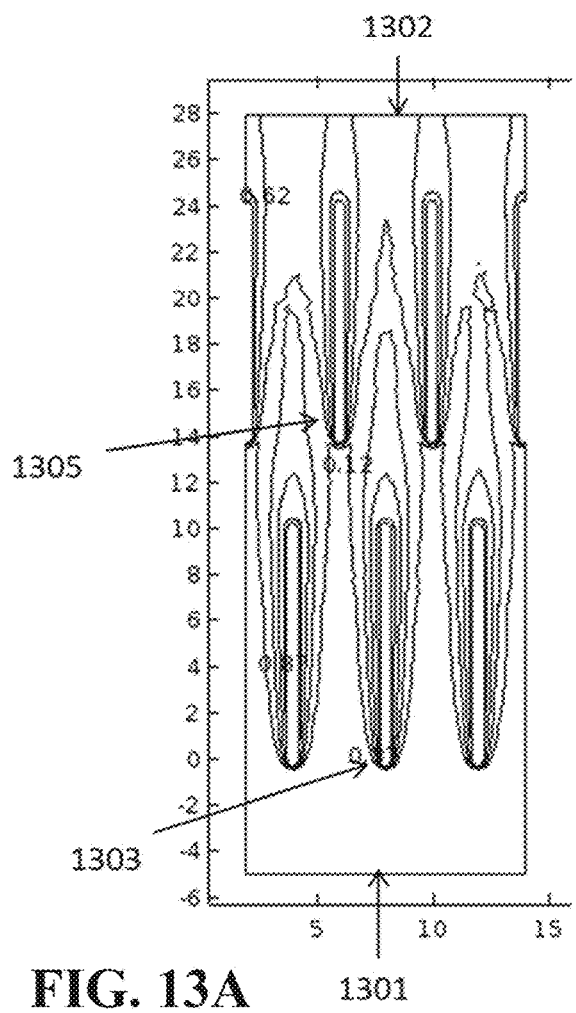
FIG. 13A shows a vapor concentration profile within a material source containing interdigitating sets of baffles according to an embodiment disclosed herein.
Figure 13B:
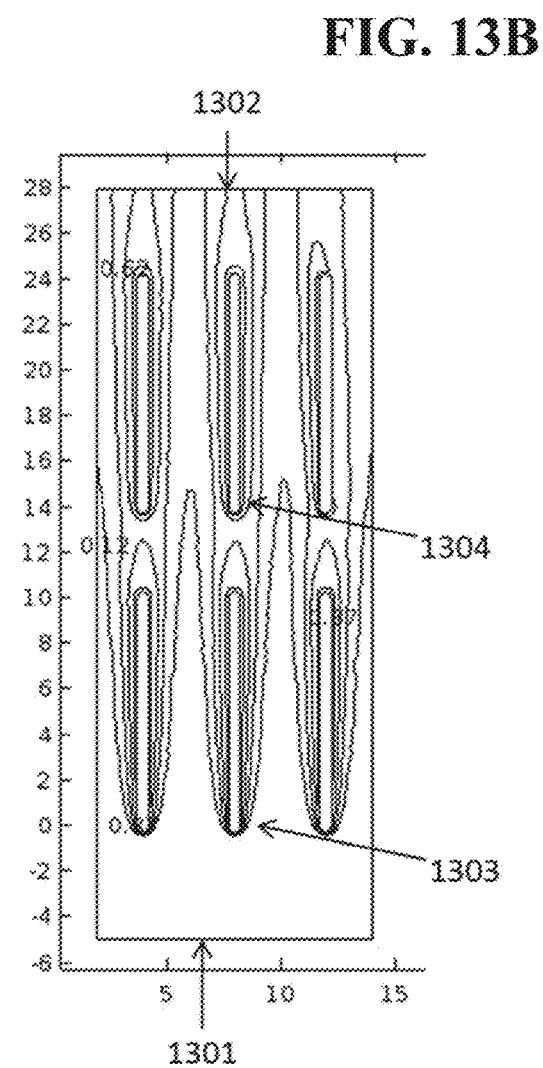
FIG. 13B shows a vapor concentration profile within a material source containing in-line sets of baffles according to an embodiment disclosed herein.
Figure 14A:
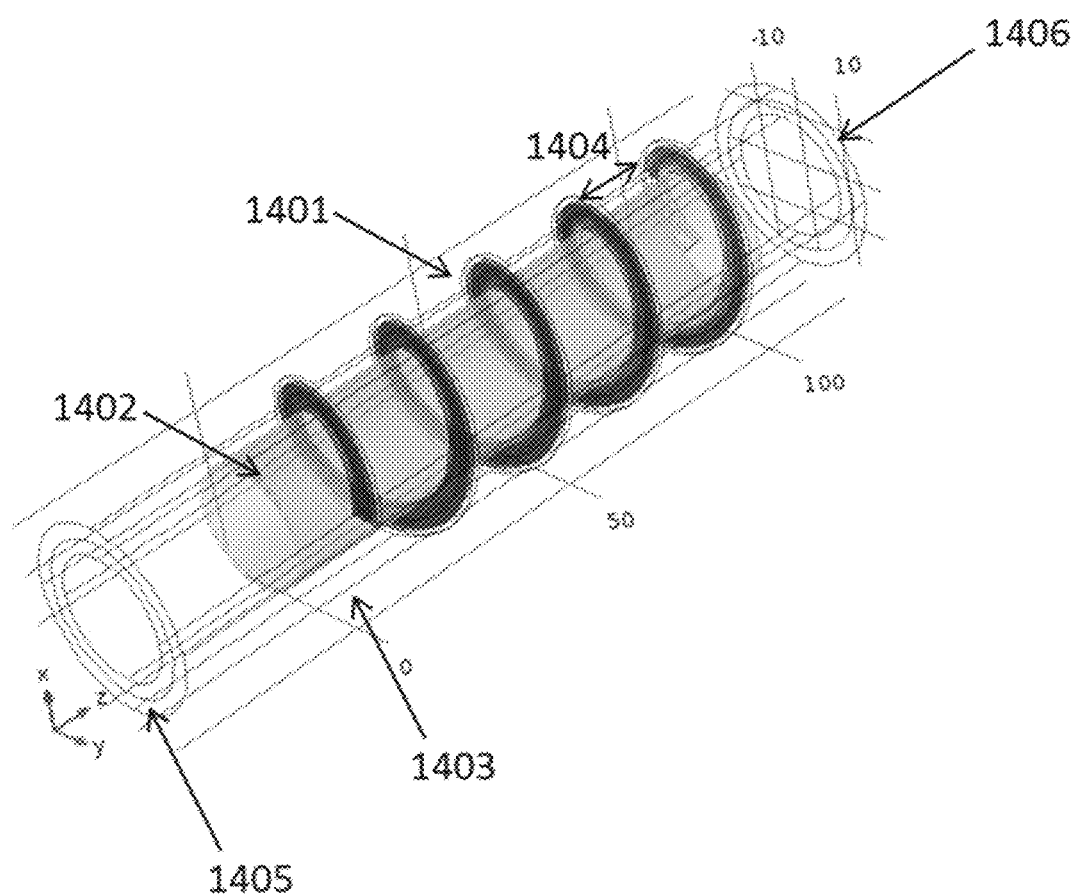
FIGS. 14A and 14B show a helical baffle configuration with uniform or variable headspace as a function of flow path according to an embodiment disclosed herein.
Figure 14B:
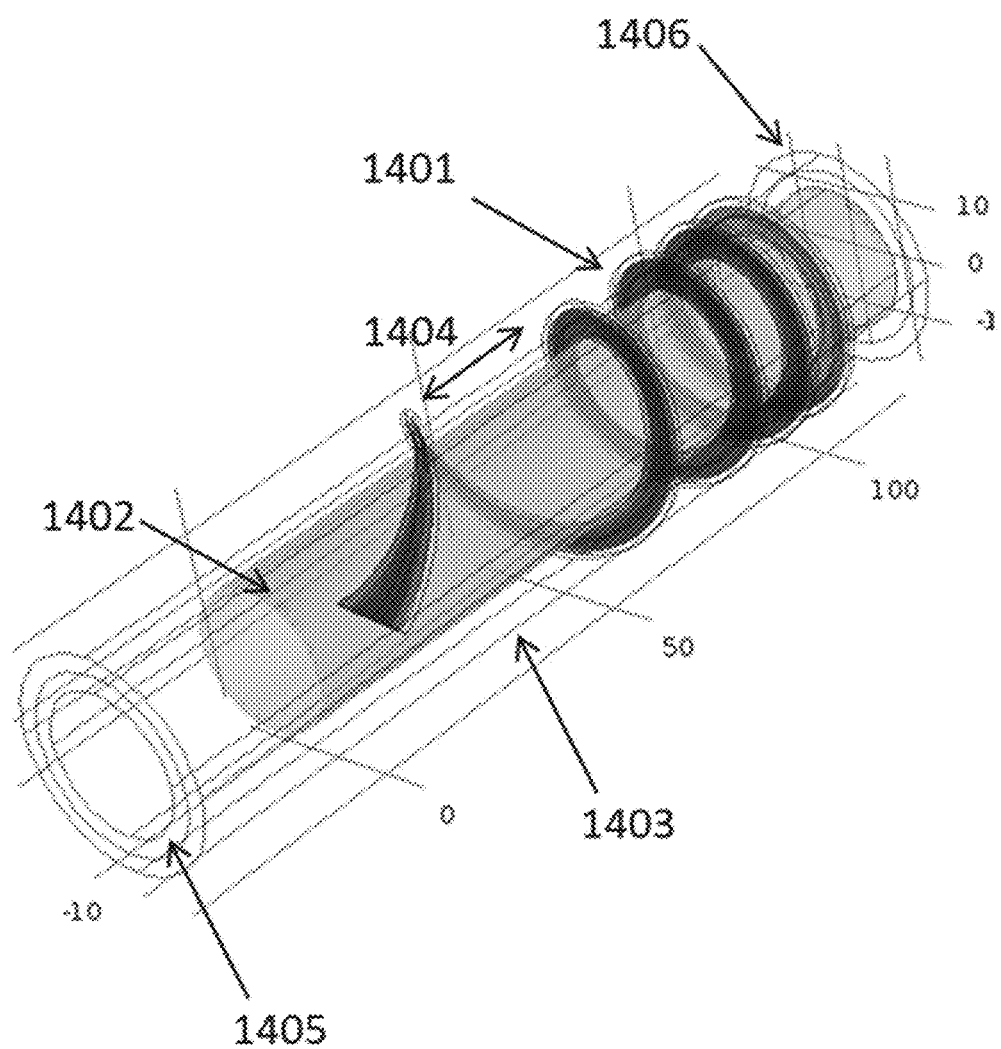
Figure 15:
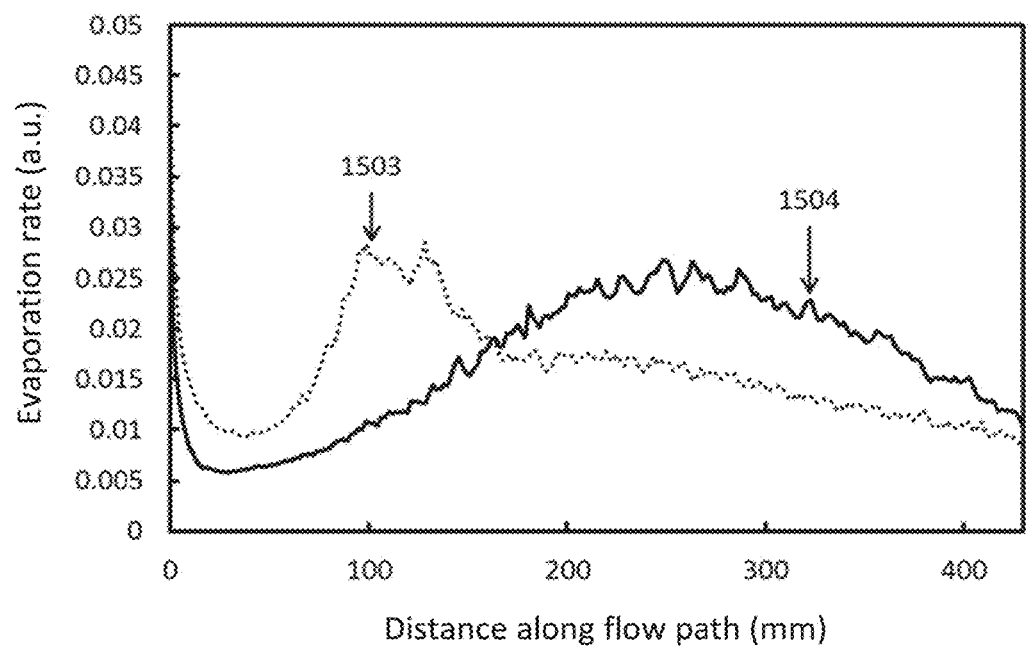
FIG. 15 shows a plot of a rate of evaporation as a function of flow path for sources as illustrated in FIGS. 14A and 14B according to an embodiment disclosed herein.
Figure 16:
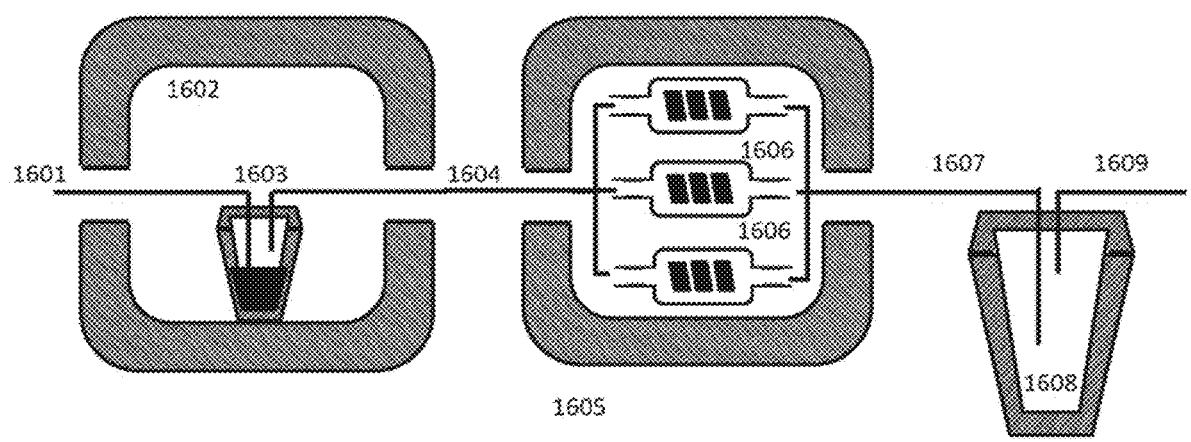
FIG. 16 shows an example configuration of a system for recharging sublimation sources according to an embodiment disclosed herein.

Accordingly, in an embodiment, baffles may be arranged so that streamlines of gas flow that did not previously contact a baffle are brought into contact with one as the gas flow progresses through the source. One such configuration is to interdigitate baffles within the source. FIG. 13A shows a vapor concentration profile within an example material source containing interdigitating baffles. FIG. 13B shows the vapor concentration profile for a similar arrangement having in-line baffles. In each case, gas flow moves from a lower boundary 1301 to an upper boundary 1302. The vapor saturation over the baffles is given by a contour plot. Contours are closely spaced along the leading edges 1303 of the upstream row of baffles for both cases, indicating a large concentration gradient and therefore rapid evaporation. However, if the second row of baffles 1304 is in line with the first row, as illustrated in FIG. 13B, the contour lines around the baffles are more widely spaced, indicating slower evaporation. If the second row of baffles is interdigitated with the first row, as shown in FIG. 13A, the contours around the leading edges 1305 are closely spaced, indicating rapid evaporation. Accordingly, it has been found that interdigitation of the baffles may improve output saturation of the carrier gas by 22% or more relative to a case where the sets of baffles are arranged directly downstream from each other. FIG. 13A illustrates an example baffle arrangement that can be used to increase the mass transfer from a given surface to a carrier gas flow. However, other arrangements may be used in addition to, or instead of interdigitated baffles.

The surface area required for a material source also may be reduced by introducing passive mixing elements into the flow path of the carrier gas within the source, such as to create patterns of turbulence and recirculation over the coated baffles. For example, one or more baffles or similar structures within a source as disclosed herein may have or be formed of turbulence-inducing structures that cause carrier gas passing through the source to follow particular flow paths and/or to exhibit a degree of turbulence. Such structures may include, without limitation, arc-like structures that induce eddy flow in the carrier gas, chevron structures or grooves to induce turbulence and guide the flow of carrier gas, or the like. More generally, turbulence-inducing structures may include depressions or prominences such as grooves, ridges, columnar structures, hemispheres, or any other similar structure. The structures may be arranged in an array, i.e., a repeated rectangular arrangement, or any other repeated, periodic, or non-repeated arrangement. The mixing elements themselves also may be coated with sublimable material. The effect of variable headspace illustrated in FIG. 8 also may be used in a source structure with internal baffles. Examples of such a structure are shown in FIGS. 14A and 14B. In these examples, the baffle includes a single helical ramp 1401 surrounding the central mandrel 1402. The ramp forms a seal with the tube 1403, so that flow follows the ramp. The axial spacing, or pitch, 1404 of the rungs of the helix in FIG. 14A is constant, so the headspace formed between adjacent turns of the helical ramp is constant as well. The pitch of the helix in FIG. 14B is larger near the inlet 1404 of the source, and decreases closer to the outlet 1405. This creates a smaller headspace in sections further downstream. In the illustrated example, the headspace between rungs of the helix reduces by roughly a factor of 2 between revolutions of the helical ramp.

Similar to the results described previously with respect to FIG. 8, the variation in headspace along the flow path in a source configuration as shown in FIG. 14B may change the evaporation behavior of the source. FIG. 15 shows the evaporation rate as a function of flow path for configurations as shown in FIGS. 14A and 14B. The flow path is plotted in millimeters from the start of the helix on the horizontal axis, and the evaporation rate in arbitrary units is shown on the vertical axis. The evaporation curve 1503 generated by constant pitch helix, such as shown in FIG. 14A, features relatively fast evaporation near the upstream portions of the source that reduces precipitously downstream. In contrast, the evaporation curve 1504 generated by a variable pitch helix such as shown in FIG. 14B has its regions of rapid evaporation shifted farther downstream compared to the curve 1503, but the evaporation rate drops off less precipitously. Overall, more material is transferred to a carrier gas stream by the variable pitched helix than the constant pitch helix design. For example, a 1000 sccm flow results in a source that is 91% saturated in the case of the variable pitch helix, while it is only 80% saturated for the constant pitch helix. Both the constant and variable pitch designs have comparable surface area, with values of 54 and 56 $cm^2$, respectively.

A source as disclosed herein may be charged (i.e., loaded with organic material to be deposited when the source is used in a deposition apparatus) or recharged by condensing organic vapor within it, essentially running the evaporation process in reverse. For example, a source cell as disclosed herein may be connected in series to another sublimation source. The source cell then may receive a stream of organic vapor laden carrier gas generated by the other sublimation source, which condenses on structures within the source. The rate and locations of condensation within the source cell may be controlled, for example by adjusting the temperature profile within the source cell. It generally may be preferred for the temperature within the source cell to be lower, or slightly lower, than the sublimation temperature of the condensing material. If the temperature is too high, the material will not condense on the source at a sufficient rate. If it is too low, material will tend to build up in upstream portions of the source to a point of fouling without penetrating downstream. Setting the temperature at a proper intermediate level allows for uniform coverage of organic material.

In an embodiment, even distribution of the material within the source cell may be further facilitated by establishing a temperature gradient across the source, so that upstream portions are maintained at a higher temperature than downstream portions. Such a temperature gradient will cause the material to be more likely to migrate downstream. In general, the effect of a temperature gradient on the recharge of a source is analogous to the effect of temperature on evaporation of the material to be deposited within the source. Material is more prone to deposit in cooler regions where it is less likely to evaporate, while it is less prone to deposit in warmer regions where it is more likely to evaporate. It is also possible to deliberately vary the thickness of material deposited within in the source as a function of path length by controlling the temperature gradient. For example, the gradient may be selected so that material deposits most heavily in locations where evaporation is most rapid. An arrangement such as illustrated in FIG. 7 may be realized in this way. Source stability and lifetime may be improved by depositing larger aliquots of material during loading in locations where material evaporates more quickly during source operation.

An example of a sublimation source filling system as disclosed herein is shown in FIG. 16. An inert carrier gas 1601 is fed into a furnace 1602 containing a vessel 1603 filled with the sublimable material. In an embodiment, the sublimable material may be an organic material to be deposited during fabrication of a device such as an OLED, a component or precursor of such a material, or the like. The carrier gas 1601 picks up vapor from the charge in the vessel 1603 and flows through a heated runline into another furnace or section of the furnace 1605. This region may be cooler than the furnace containing the initial charge of material, for example so that vapor may condense on one or more sources 1606 connected to the runline. Carrier gas passes through the sources and leaves, depleted of vapor, through an exhaust line 1607. The exhaust line may pass through a filter or cold trap 1608 that captures high volatility components. The clean carrier gas 1609 then may be expelled towards a vacuum source further downstream. Once filled, the sources can be removed from the furnace and used in a deposition device.

Alternatively or in addition, one or more mandrels, baffles, or similar source structures may be removed from a source vessel and separately coated with organic material. For example, mandrels may be coated by a line of sight technique such as vacuum thermal evaporation (VTE), a conformal technique such as organic vapor phase deposition, or any other suitable technique. Each baffle may be removable from the source separately from the others, for example to allow for recharging of only those baffles that have exhausted a supply of material if the baffle coatings are exhausted unevenly. Alternatively, the baffles may be removable as a unit. Configurations using removable baffles may allow for a relatively fast recharge of a fixed source. However, in contrast to a technique as shown in FIG. 16, a source vessels generally will need to be partially or entirely disassembled. In contrast, sources filled by a flow-through technique may be one-piece units. In some cases, such sources may be sealed or otherwise constructed to prevent or disallow opening, disassembly, or the like by an end user.

Using an evaporation and condensation process to charge a source, such as illustrated in FIG. 16, also may add an additional purification step for the organic material being added to the source. In some conventional techniques, thermal gradient sublimation (S. R. Forrest Chem. Rev. 1997, 97, 1793-1896) or the like is used to purify OLED materials prior to physical vapor deposition processes. In this process, an aliquot of material is placed in an evacuated tube that is then placed in a furnace so that the material is at the hottest point within the tube. The temperature in that region is slightly greater than the material's sublimation temperature, so the material migrates to a cooler portion of the tube below its sublimation temperature. High volatility impurities will migrate to the coolest portions of the tube, while low volatility impurities will remain at the starting point. Material collected from the correct portion of the tube will therefore be purer than the originally loaded material.

A similar process and/or result may be achieved in the presence of a rarified carrier gas, and it can be at least approximated by either of the previously described loading procedures. This may allow for loading of a source and final purification of the material within the source in a single step or process, thereby providing for shorter processing times and simpler processing techniques than may be achievable using conventional methods. If a source cell as disclosed herein is held at the correct temperature, high volatility impurities will flow across the surface area of the source without condensing while low volatility impurities do not evaporate and are therefore not loaded into the source. Thus, the primary or only material that will condense within the source cell is the purified desired compound.

In some embodiments, baffles or similar source structures as disclosed herein may be coated with an initial coating, prior to the sublimable material be deposited on the baffles as previously disclosed. For example, one or more baffles may be coated with a chemically inert film. Such a coating may allow for improved efficiency by allowing more material to be entrained within a carrier gas, more efficient recharging and/or cleaning of the baffles, and the like.

In some embodiments, a material may be disposed on only a portion of one or more baffles within a source as disclosed herein, or the material may be disposed only on structures other than baffles within the source. For example, the material may be disposed on opposite surfaces of adjacent baffles, such that a region between the baffles is filled with the material. Alternatively, the baffles may define a region within which the material is disposed, such that the baffles provide varying headspace above or across the material.

As previously disclosed, the use of a source as disclosed herein may provide for a higher, more efficient concentration of carrier gas with a desired material. Hence, in some configurations it may be desirable for the source cell itself, or a deposition within which the source will be used, to include a source of dilution gas. Thus, the dilution gas in combination with the material-loaded carrier gas may provide a total concentration equivalent to concentrations expected from conventional sources. This may allow for a source as disclosed herein to be used in a deposition apparatus in place of a conventional source, without requiring modification of the deposition apparatus. The source cell may include a source of dilution gas flow that can be connected to a source of dilution gas, such as a dilution inlet. The dilution gas itself may be provided in a dilution gas source that is integral with the material source, or it may be provided from an external source that is placed in fluid communication with the dilution gas flow of the source cell.

The use of a source cell configuration and associated processes as disclosed herein also may allow for preparing, loading, transporting, and use of a source cell without requiring additional or specialty preparation or processing by an end user of the source, such as an operator of a material deposition system. For example, a material supplier may obtain a source cell as disclosed herein and charge the source using the techniques disclosed herein, resulting in a charged source containing a purified material to be used in a deposition system. The source then may be transported to an end user, such as an operator of a deposition system or the like, without additional preparation or specialty packaging of the source.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A method for operating a material source having a cavity with a gas inlet port and a gas outlet port distinct from the gas inlet port, a plurality of baffles disposed within the cavity and physically positioned within the cavity to prevent a direct gas flow between the gas inlet port and the gas outlet port, and a coating of a material to be entrained in an outflow of gas from the gas outlet port disposed on at least one baffle of the plurality of baffles, the method comprising:

providing a carrier gas to the cavity via the gas inlet port at sufficient velocity that the carrier gas exits the cavity via the gas outlet port.

2. The method of claim 1, further comprising operating the source at elevated temperature relative to the ambient environment and/or relative to sublimation temperature of the material used in the source.

3. The method of claim 1, further comprising operating the material source at a temperature gradient along a path between the gas inlet port and the gas outlet port.

4. The method of claim 1, further comprising maintaining the material source within 20 C of a sublimation temperature of the coating at vacuum.

5. The method of claim 1, further comprising maintaining the material source in a deposition system and maintaining the material source at a temperature 5-20 C below a temperature at which a linear material source is maintained when used in the deposition system.

6. The method of claim 1, wherein the coating has a different thickness depending upon a position within the cavity of the at least one baffle on which the coating is deposited.

7. A method for preparing a material source apparatus having a cavity with a gas inlet port and a gas outlet port distinct from the gas inlet port, a plurality of baffles disposed within the cavity and physically positioned within the cavity to prevent a direct gas flow between the gas inlet port and the gas outlet port, and a coating disposed on at least one baffle of the plurality of baffles, the method comprising:

cooling the material source apparatus below a sublimation temperature of a material to be deposited within the material source apparatus; and providing a carrier gas saturated with the material to be deposited to the cavity via the gas inlet port.

8. The method of claim 7, further comprising maintaining the temperature of the cavity at a temperature not greater than a sublimation temperature of the material to be deposited.

9. The method of claim 7, where a temperature gradient exists so that the baffle surfaces in proximity to the inlet port are warmer than the baffle surfaces in proximity to the outlet port.

10. The method of claim 7, wherein the material deposited within the material source apparatus has fewer impurities than a material charge from which the material deposited within the material source apparatus is generated.

11. The method of claim 7, wherein a temperature gradient exists such that material deposits in the source so that deposited material is thicker on a portion of the at least one baffle at a position closer to the gas inlet port than to the gas outlet port, relative to deposited material on a portion of the at least one baffle at a position closer to the gas outlet port than the gas inlet port.

* * * * *